US009256249B2

(12) United States Patent
Truong et al.

(10) Patent No.: US 9,256,249 B2
(45) Date of Patent: Feb. 9, 2016

(54) STAND ASSEMBLY AND MONITOR

(71) Applicant: Lenovo (Singapore) Pte. Ltd., Singapore (SG)

(72) Inventors: Cuong Huy Truong, Cary, NC (US); David Wayne Hill, Cary, NC (US); John David Swansey, Durham, NC (US); Thomas John Sluchak, Apex, NC (US)

(73) Assignee: Lenovo (Singapore) Pte. Ltd., Singapore (SG)

( * ) Notice: Subject to any disclaimer, the term of this patent is extended or adjusted under 35 U.S.C. 154(b) by 234 days.

(21) Appl. No.: 13/895,317

(22) Filed: May 15, 2013

(65) Prior Publication Data
US 2014/0340827 A1 Nov. 20, 2014

(51) Int. Cl.
| | |
|---|---|
| G06F 1/16 | (2006.01) |
| H05K 5/00 | (2006.01) |
| H05K 7/00 | (2006.01) |
| A47F 5/12 | (2006.01) |
| F16F 5/00 | (2006.01) |
| H05K 7/16 | (2006.01) |
| A47F 5/00 | (2006.01) |
| E04G 3/00 | (2006.01) |
| G06F 1/20 | (2006.01) |

(52) U.S. Cl.
CPC ............... *G06F 1/1601* (2013.01); *G06F 1/16* (2013.01); *H05K 7/16* (2013.01); *A47F 5/00* (2013.01); *A47F 5/12* (2013.01); *E04G 3/00* (2013.01); *G06F 1/20* (2013.01)

(58) Field of Classification Search
CPC ........... G01F 1/16; G01F 1/1601; H05K 7/16; A47F 5/00; A47F 5/12; E04G 3/00; G06F 1/20; F28F 13/00
USPC ............. 361/679.06, 679.22, 679.09, 679.21, 361/679.26–679.28; 248/133, 917, 918, 248/921–923; 267/64.12
See application file for complete search history.

(56) References Cited

U.S. PATENT DOCUMENTS

| | | | | |
|---|---|---|---|---|
| 6,288,891 | B1 * | 9/2001 | Hasegawa et al. | 361/679.07 |
| 7,198,237 | B2 * | 4/2007 | Cho et al. | 248/133 |
| 2007/0095993 | A1 * | 5/2007 | Yamamoto | 248/284.1 |
| 2013/0319638 | A1 * | 12/2013 | DEGNER et al. | 165/104.21 |

* cited by examiner

*Primary Examiner* — Courtney Smith
*Assistant Examiner* — Zhengfu Feng
(74) *Attorney, Agent, or Firm* — Brian J. Pangrle (57) ABSTRACT

A system can include a platform that includes a front end and a back end; a support that includes a column, an extension and an arm joint disposed on the extension, where the column extends vertically from the platform and where the extension extends from the column at an acute angle and positions the arm joint vertically above the platform and toward the back end of the platform; a monitor mount that includes an arm joint; a monitor that includes a computing device and a touch screen, the monitor being mountable to the monitor mount; and an arm coupled at a pivot end to the arm joint of the support and coupled at a free end to the arm joint of the monitor mount, the monitor mount being pivotable about the free end of the arm. Various other apparatuses, assemblies, systems, methods, etc., are also disclosed.

20 Claims, 10 Drawing Sheets

STAND ASSEMBLY AND MONITOR

TECHNICAL FIELD

Subject matter disclosed herein generally relates to assemblies for monitors and monitors.

BACKGROUND

As visual interfaces continually evolve for display of information, touch input, etc., users are demanding more flexible ergonomic systems to support such interfaces. For example, consider a monitor that can display information as well as optionally operate as a touch screen keyboard, drafting table, etc. At times, a user may desire an ergonomic configuration better suited to visualization of information while, at other times, a user may desire an ergonomic configuration better suited to touch input. As described herein, various assemblies can provide for flexible ergonomics.

SUMMARY

A system can include a horizontal platform that includes a front end and a back end; a support that includes a column, an extension and an arm joint disposed on the extension, where the column extends vertically from the horizontal platform and where the extension extends from the column at an acute angle and positions the arm joint vertically above the horizontal platform and toward the back end of the horizontal platform; a monitor mount that includes an arm joint; a monitor that includes a computing device and a touch screen, the monitor being mountable to the monitor mount; and an arm coupled at a pivot end to the arm joint of the support and coupled at a free end to the arm joint of the monitor mount, the monitor mount being pivotable about the free end of the arm. Various other apparatuses, assemblies, systems, methods, etc., are also disclosed.

BRIEF DESCRIPTION OF THE DRAWINGS

Features and advantages of the described implementations can be more readily understood by reference to the following description taken in conjunction with examples of the accompanying drawings.

DETAILED DESCRIPTION

The following description includes the best mode presently contemplated for practicing the described implementations. This description is not to be taken in a limiting sense, but rather is made merely for the purpose of describing the general principles of the implementations. The scope of the invention should be ascertained with reference to the issued claims.

Figure 1:
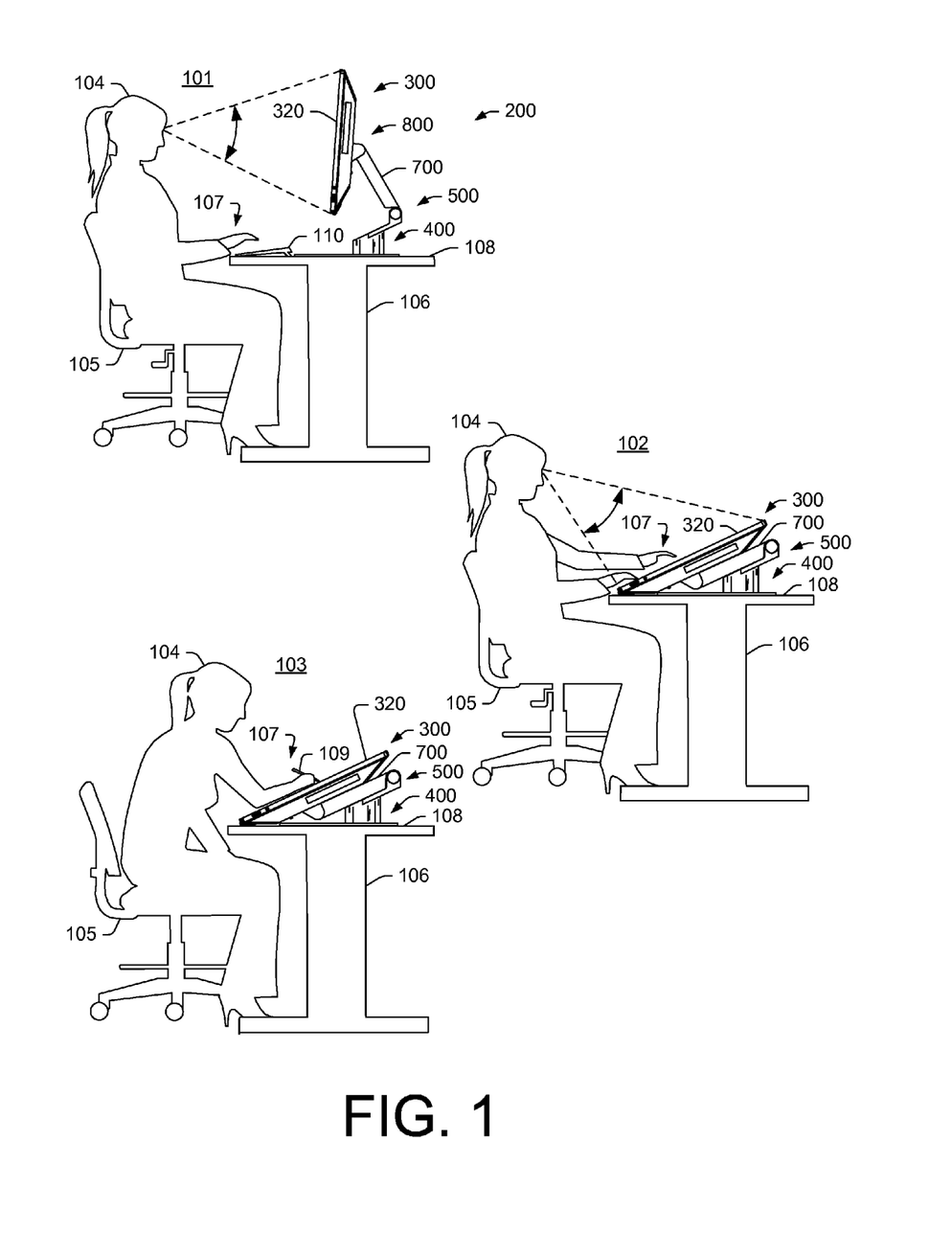
FIG. 1 is a diagram of examples of three scenarios for usage of an example of a monitor mounted to an assembly.

FIG. 1 shows example scenarios 101, 102 and 103 where a user 104 is seated in a chair 105 before a table 106 with a surface 108 that an assembly 200 and a monitor 300 with a screen 320 (e.g., a display surface). As shown, the assembly 200 can include a platform 400 (e.g., to support the assembly 200 on a surface such as the surface 108 of the table 106) and a support 500 that supports a pivotable arm 700 that includes a mount 800 for mounting the monitor 300 to the assembly 200. The assembly 200 provides for positioning of the monitor 300, for example, in a free orientation as shown in the scenario 101 and in touch mode orientations as shown in the scenarios 102 and 103 (e.g., the monitor 300 may be configured with touch circuitry for making the screen 320 a touch screen). As an example, the monitor 300 may include a computing device and a touch screen (e.g., via touch circuitry such as a capacitive touch circuitry or other touch circuitry).

For the scenario 101, a keyboard 110 may be provided for input of characters, commands, etc. For the scenario 102, the user 104 may use one or both of her hands 107 to touch the screen 320 for input of commands, information, etc. For the scenario 103, the user 104 may hold a stylus 109 and position the stylus 109 with respect to screen 320 for input of commands, information, etc. For example, the user 104 may touch the screen 320 with the stylus 109 to select one or more controls, to draw, etc.

As shown, for the scenarios 101, 102 and 103, the user 104 may have an angle of view (or view angle) for comfortably viewing the screen 320. As an example, the assembly 200 can allow for various adjustments to enhance ergonomics of a user's environment (e.g., depending on user comfort, tasks, etc.). Such adjustments may be achieved quickly and easily via a user's hand or hands, even while the user may remain seated. For example, the user 104 in scenario 101 may set the keyboard 110 aside, grab the monitor 300 with both hands and tilt it to achieve a touch mode orientation, per the scenario 102 or the scenario 103. As necessary, the user 104 may extend the monitor 300 as mounted to the assembly 200 forward to readily allow for touching with her hands 107 part of the screen 320 or the entire screen 320 per the scenario 102. As an example, the user 104 may hold an implement such as the stylus 109 to enter information or select one or more controls, regions, etc. displayed via the screen 320 per the scenario 103. As shown, the user 104 may achieve a suitable ergonomic environment for the scenarios 101, 102 and 103, optionally without adjustment to the chair 105 or the table 106.

Figure 2:
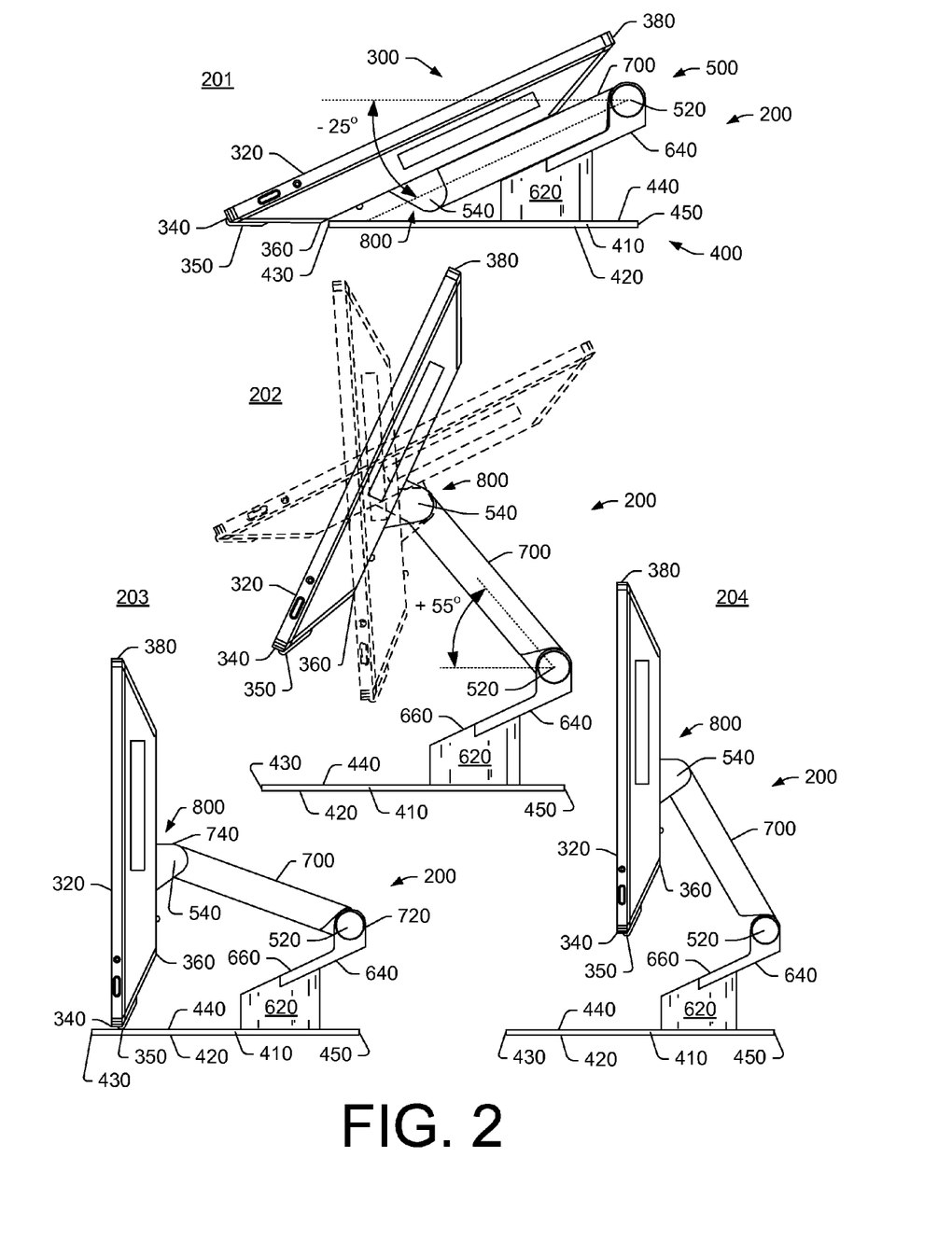
FIG. 2 is a diagram of examples of four scenarios for usage of an example of a monitor mounted to an assembly.

FIG. 2 shows various views of the assembly 200 with the monitor 300 in orientations 201, 202, 203 and 204. As an example, a system can include the assembly 200 and the monitor 300. For example, a system can include the platform 400, the support 500, the arm 700 and the mount 800 with the monitor 300 mounted to the mount 800.

As shown in the example of FIG. 2, the platform 400 may be oriented horizontally and include an edge 410 disposed between a lower surface 420 and an upper surface 440 where the edge 410 includes a front end 430 and a back end 450. As an example, the edge 410 may be a perimeter of the platform 400, which may define an area or footprint for the platform 400. In the example orientations 201, 202, 203 and 204, the center of mass of the monitor 300, which may have a mass that exceeds that of the assembly 200, remains above the area or footprint of the platform 400.

As an example, the platform 400 can include a midpoint located approximately halfway between the front end 430 and the back end 450, which may define, in part, location of the support 500 as attached to the platform 400. Further, as an example, the midpoint may define, in part, a range for orientations of the monitor 300, for example, where, in possible vertical orientations of the monitor 300, the screen 320 of the monitor remains fore of the midpoint of the platform 400 (e.g., and aft of the front end 430 of the platform 400).

As shown in the example of FIG. 2, the support 500 can include a column 620, an extension 640 and an arm joint 520 disposed on the extension 640 where the column 620 extends vertically from the horizontal platform 400 and where the extension 640 extends from the column 620 at an acute angle and positions the arm joint 520 vertically above the horizontal platform 400 and toward the back end 450 of the horizontal platform 400. In the example of FIG. 2, the support 500 includes a surface 660, for example, that extends at an angle with respect to the horizontally oriented platform 400. Such a surface may act as a stop surface, for example, to form a contact with a surface of the arm 700 to limit pivoting of the arm 700 in the arm joint 520 and, for example, to support the weight of the arm 700 and a monitor attached thereto via the mount 800.

As shown in the example of FIG. 2, the mount 800 may be a monitor mount for mounting of the monitor 300 that includes an arm joint 540 and the arm 700 can include a pivot end 720 and a free end 740 where the arm 700 can be coupled at the pivot end 720 to the arm joint 520 of the support 500 and coupled at the free end 740 to the arm joint 540 of the monitor mount 800, for example, where the monitor mount 800 is pivotable about the free end 740 of the arm 700 (e.g., via the arm joint 540). As an example, in the touch mode orientation 201, the arm 700 may contact, on a lower side, an upper surface of the support 500 (consider, e.g., the surface 660) and may contact, on an upper side, a back side surface of a monitor mounted to the arm 700 via the mount 800. In such an example, the weight of the monitor may be transferred to the upper surface of the support 500 via the arm 700.

As shown in the example of FIG. 2, the monitor 300 includes a bottom edge 340, a top edge 380 and a back side edge 360 where a bumper 350 (or bumpers) are mounted to the monitor 300, for example, at the bottom edge 340 and extending toward the back side edge 360. In the touch mode orientation 201, the bumper 350 may contact, along a first side, a surface such as the surface 108 of the table 106 on which the platform 400 is supported. In such an example, the monitor 300 may be supported via contact with the arm 700 and via bumper contact with another surface that supports the platform 400. In the vertical orientation 203, the bumper 350 may contact, along a second side, the upper surface 440 of the platform 400. In such an example, the monitor 300 may be supported, in part, via bumper contact with the upper surface 400 of the platform 400. As to the free orientations 202 and 204, the monitor 300 is supported by the arm 700, as connected to the support 500, which is attached to the platform 400. Thus, the example orientations of FIG. 2 include some with bumper contact (e.g., the orientations 201 and 203) and some without bumper contact (e.g., the orientations 202 and 204).

As an example, the assembly 200 may include a minimum pivot angle for the arm 700 and a maximum pivot angle for the arm 700. For example, the minimum pivot angle may be approximately minus 25 degrees with respect to a horizontal plane passing through the arm joint 520 that is substantially parallel to the horizontally oriented platform 400 and, for example, the maximum pivot angle may be approximately 55 degrees with respect to a horizontal plane passing through the arm joint 520 that is substantially parallel to the horizontally oriented platform 400. In such an example, the arm 700 may pivot in a range of approximately 80 degrees (e.g., from about minus 25 degrees to about 55 degrees). As an example, a minimum pivot angle may be defined by contact between a contact surface of the arm 700 and a contact surface of the support 500 (see, e.g., the surface 660). As an example, a maximum pivot angle may be defined by a stop mechanism of the arm joint 520.

Figure 3:
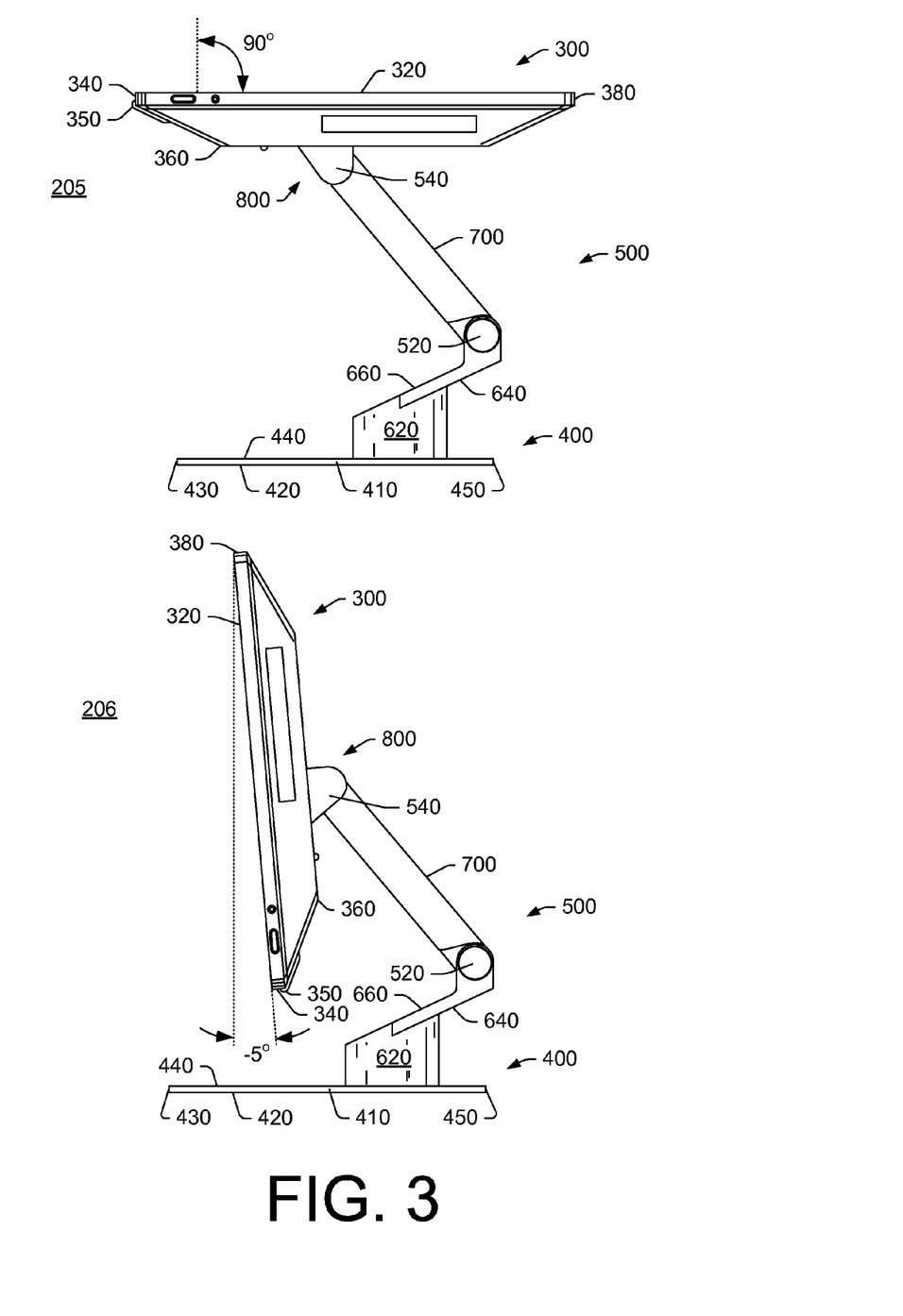
FIG. 3 is a diagram of examples of two scenarios for usage of an example of a monitor mounted to an assembly.

FIG. 3 shows the assembly 200 and the monitor 300 of FIG. 2 in two additional orientations 205 and 206. In the example of FIG. 3, the orientation 205 may be referred to as a table orientation where the arm 700 supports the monitor 300 substantially parallel to the horizontal platform 400, for example, at a maximum pivot angle of the arm 700 about the arm joint 520 of the support 500. As to the orientation 206, it is a free orientation where the arm 700 supports the monitor 300 and where the monitor 300 is pivoted about the arm joint 540 at an angle of approximately minus 5 degrees with respect to vertical (e.g., using the horizontally oriented platform 400 as a reference). As an example, in the table orientation 205, one or more tokens may be positioned on the screen 320 of the monitor 300. For example, a passive token, an active token or a combination of passive and active tokens may be positioned on the screen 320 (e.g., for playing a game, etc.). As an example, a table orientation may allow for multiple users to interact with the monitor 300, for example, via touching the screen 320 (e.g., where the users may be seat about the monitor 300).

In the example orientations 205 and 206, the center of mass of the monitor 300, which may have a mass that exceeds that of the assembly 200, remains above the area or footprint of the platform 400.

Figure 4:
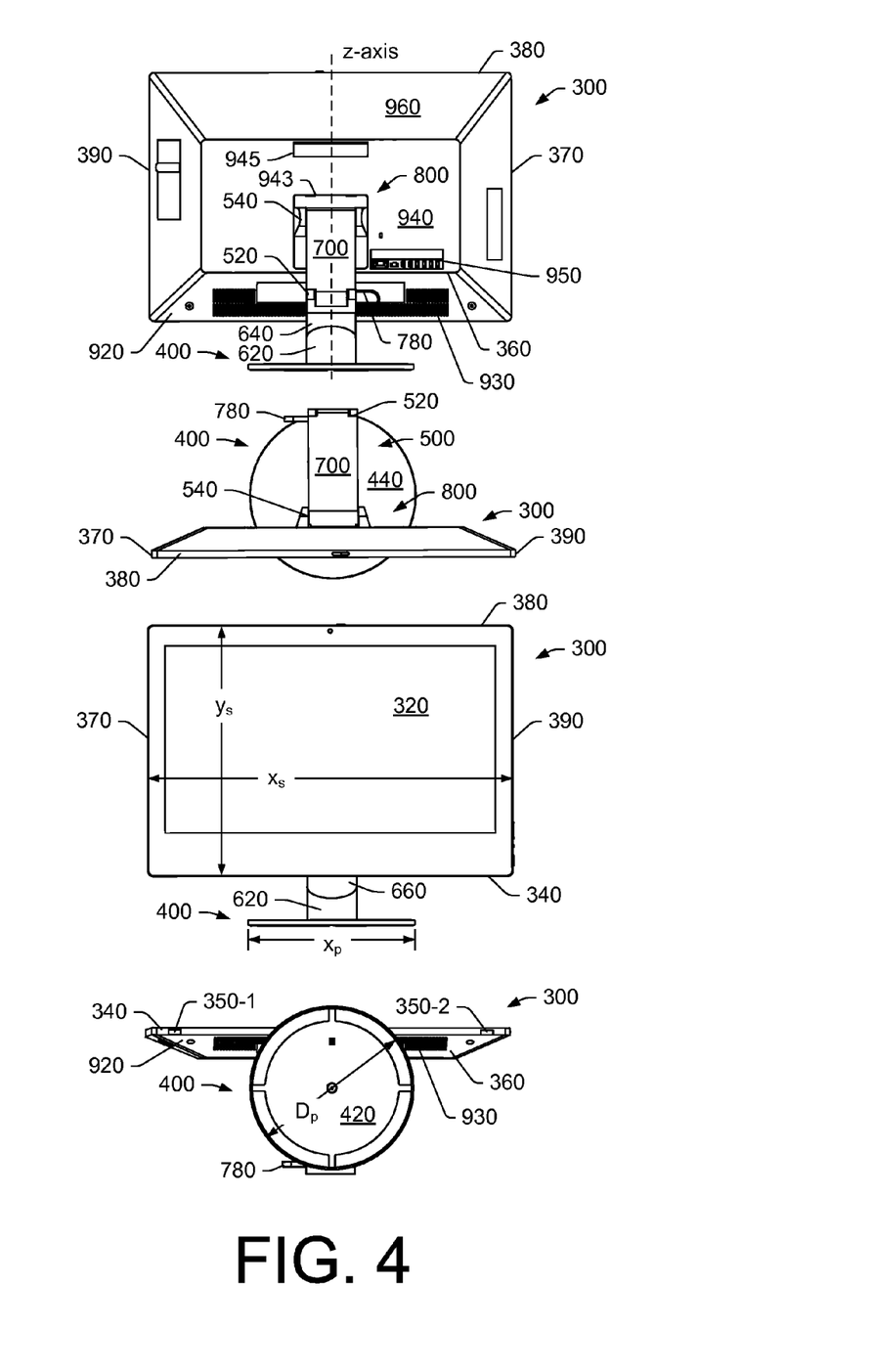
FIG. 4 is a series of views of an example of a monitor mounted to an assembly.

FIG. 4 shows various views of the assembly 200 and the monitor 300. In a bottom plan view (lower view), two bumpers 350-1 and 350-2 are shown as being attached to the monitor 300 along with a diameter ($D_p$) of the lower surface 420 of the platform 400. In a front plan view, the monitor 300 is shown as having a width ($x_s$) and a height ($y_s$), which may define a front area of the monitor 300 (e.g., between the bottom edge 340, the top edge 380, a first side edge 370 and a second side edge 390), and the platform 400 is shown as having a width ($x_p$). As an example, the monitor 300 may have a frontal surface area that exceeds the area or footprint of the platform 400 and, for example, the mass of the monitor 300 may exceed that of the platform 400. As an example, a smaller footprint may help to preserve useable desk area.

FIG. 4 also shows the support 500 as including a cable guide 780 as extending outwardly from the arm joint 520, for example, to guide one or more cables connected to the monitor 300, for example, as the monitor 300 is being positioned in a particular orientation.

In FIG. 4, a back plan view and the bottom plan view, the back side of the monitor 300 is shown as including surfaces 920, 940 and 960 as well as vents 930 and a connector recess 950, which includes connector sockets disposed at an angle (see, e.g., the angle $\phi$ in FIG. 6) for connecting one or more cables, etc. to the monitor 300. In the example of FIG. 4, the back side edge 360 is part of a perimeter of the back side surface 940, which includes a recess 943 for receipt of a portion of the mount 800 and a recess 945, for example, for receipt of a hand to help carry, mount, position, etc. the monitor 300. As shown, the surface 960 slopes from the perimeter to the top edge 380 and the surface 920 slopes from the perimeter to the bottom edge 340.

Figure 5:
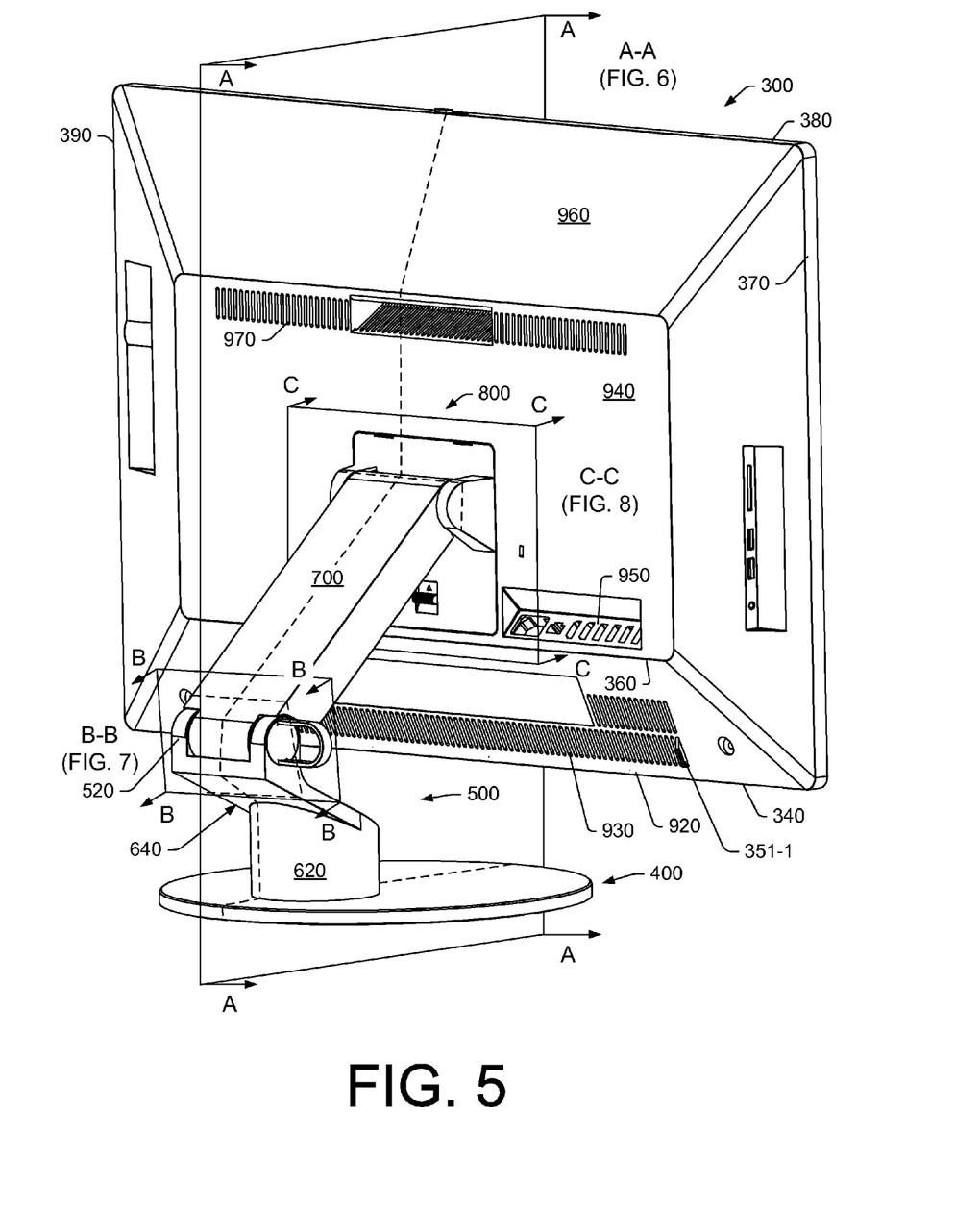
FIG. 5 is a perspective view of an example of a monitor mounted to an assembly.
Figure 6:
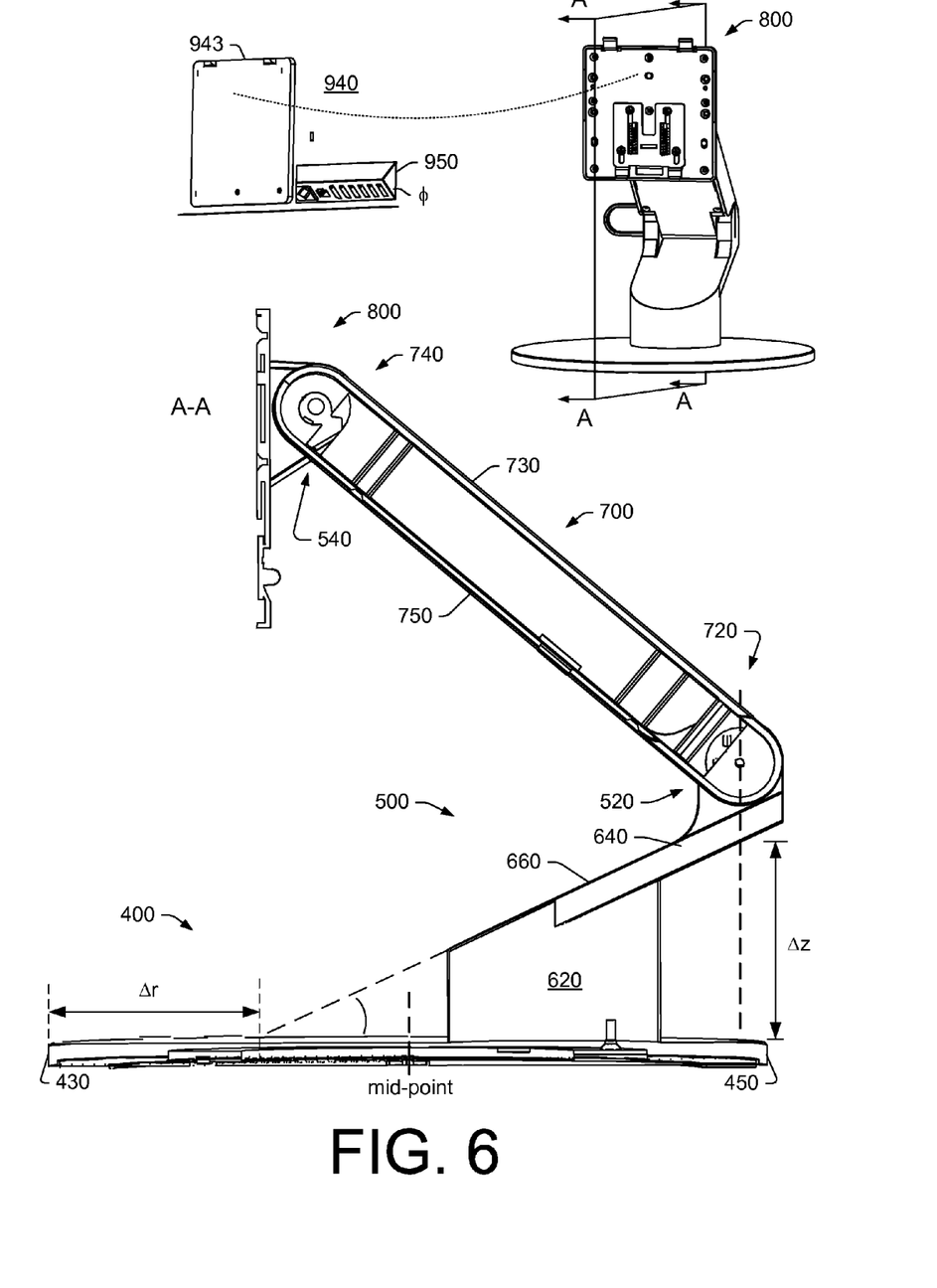
FIG. 6 is a series of views of an example of an assembly.
Figure 7:
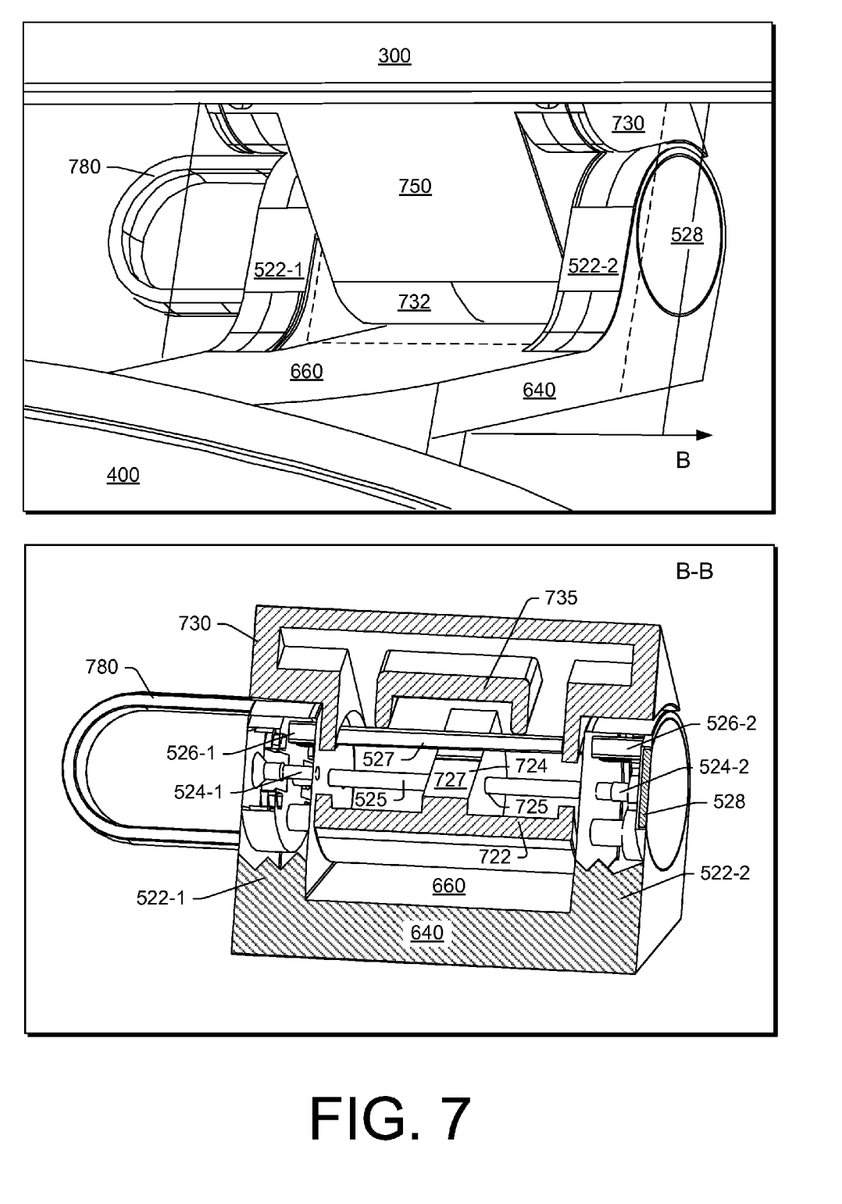
FIG. 7 is a series of views of an example of an assembly.
Figure 8:
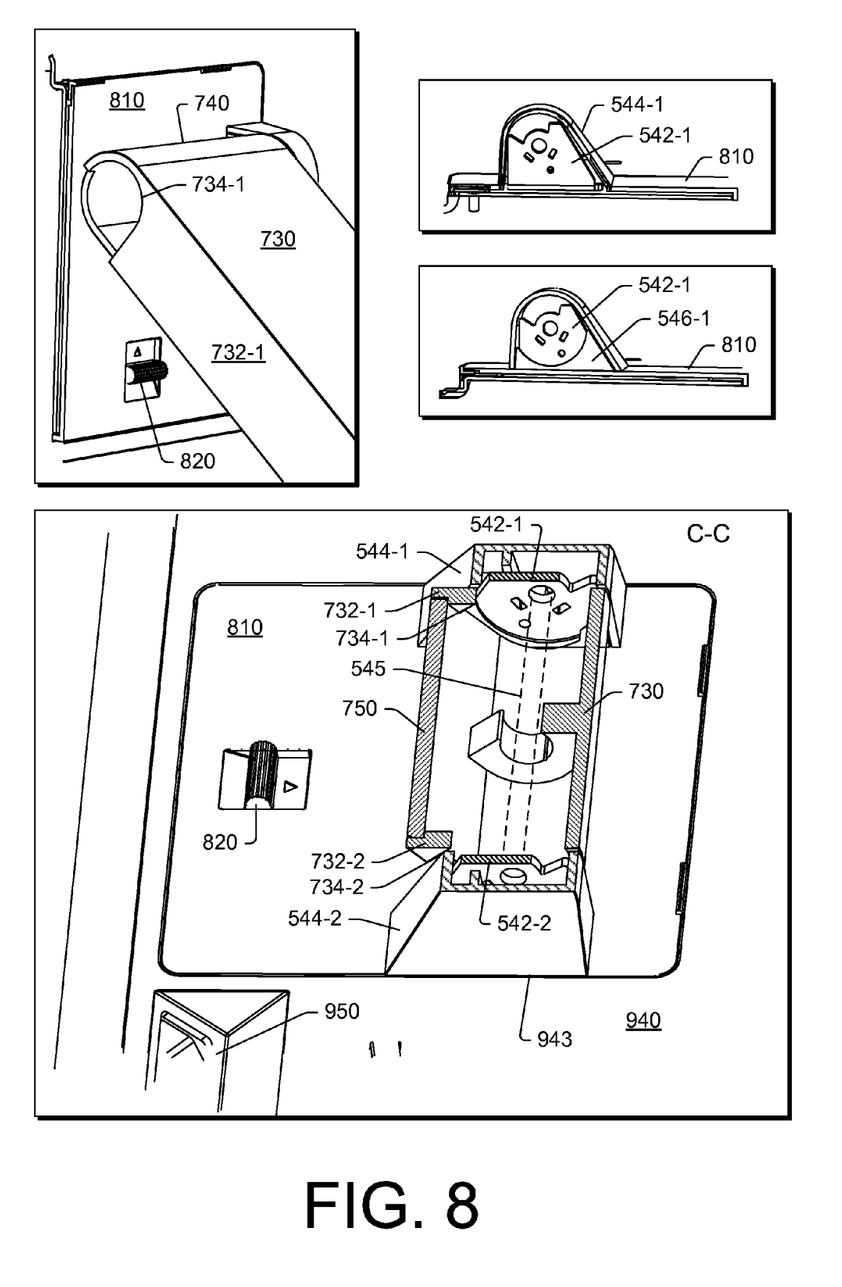
FIG. 8 is a series of views of an example of an assembly.

FIG. 5 shows a perspective view of the assembly 200 and the monitor 300 along with cutting planes A (along lines A-A), B (along lines B-B) and C (along lines C-C), corresponding cross-sectional or cut-away views are shown in FIG. 6, FIG. 7 and FIG. 8, respectively. FIG. 5 also shows vents 970 in the surface 940 and a bumper 351-1, which may be, for example, formed of an elastomer with a portion that may be received by a vent slot to secure the bumper 351-1 to the monitor 300; noting that one or more other bumpers may be secured to the monitor (e.g., 351-2, 351-3, etc.). In such an example, the bumper 351-1 may be received by a vent slot of the vents 930, for example, to define a clearance between a surface and the vents 930 to help ensure flow of air to the vents 930 for purposes of providing air flow within the monitor 300, for example, to assist with cooling, at least in part via convection of air within the monitor 300 (e.g., from the lower vents 930 to the upper vents 970).

FIG. 6 shows a cut-away view of the assembly 200 along with a perspective view of a portion of the surface 940 as including the recess 943 and a perspective view of the assembly 200 showing a face and various features thereof of the mount 800 of the assembly 200 (e.g., a spring-biased sliding plate, prongs, etc.).

In the example of FIG. 6, the arm 700 is shown as including an upper portion 730 and a lower portion 750. For example, the upper portion 730 may be made of a rigid material such as a metal or an alloy and formed as a box (e.g., with five sides) with a lower opening and the lower portion 750 may be a cover made of a plastic or other material that can be coupled to cover the lower opening of the upper portion 730. As an example, the upper portion 730 may be die-cast as a unitary component with the pivot end 720 and the free end 740. In such an example, the lower portion 750 may be a plastic cover that snaps to or otherwise is securable to the upper portion 730, for example, for removal to access one or more features of the assembly 200.

As shown in the example of FIG. 6, an axis of the arm joint 520 is located vertically above the platform 400 and the column 620 of the support 500 is located between an approximate mid-point of the platform 400 and the back end 450 of the platform 400. As an example, the column 620 and the extension 640 may be die-cast as a unitary component (e.g., die-cast metal, alloy, etc.), for example, that can be connected to the platform 400 (e.g., via bolts, etc.).

As shown in the example of FIG. 6, the extension 640 is disposed at an angle where a line extending forward from the extension intersects the platform 400 at an intersection point while providing a margin between the intersection point and the end 430 of the platform 400. When the arm 700 is in a lowermost position, a centerline extending between the arm joint 520 and the arm joint 540 extends to an intersection point closer to the end 430 of the platform 400 and, when a monitor is attached to the arm 700 via the monitor mount 800 and in a touch mode orientation, a centerline of the monitor may extend past the end 430 of the platform 400, for example, to allow one or more rubber bumpers attached to the monitor to contact a support surface upon which the platform 400 is supported (see, e.g., FIG. 9).

FIG. 7 shows a perspective view of a portion of the assembly 200 and a cut-away view of the portion of the assembly 200. As shown in the example of FIG. 7, the arm joint 520 has a U-shape with an axle support 522-1 and an axle support 522-2, which support an axle 525 via axle sockets 524-1 and 524-2 about which the arm 700 pivots at its pivot end 720. As shown, the axle supports 522-1 and 522-2 also support a bar 527 via bar sockets 526-1 and 526-2, which are part of a stop mechanism to limit pivoting of the arm 700 about the axle 525. For example, the arm 700 includes an internal block 724 that extends from an end wall 722 and that includes an aperture 725 for passage of the axle 525 and a stop surface 727 that can contact the bar 527 to define a maximum pivot angle for the arm 700 with respect to the arm joint 520 of the support 500.

In the example of FIG. 7, the arm joint 520 includes a cap 528 as a cover on one side and the cable guide 780 on an opposing side. Further, the example of FIG. 7 shows the arm 700 as including an internal brace 735 to provide the arm 700 with additional structural integrity, for example, to support a monitor mounted to the free end 740 of the arm 700 (e.g., via the mount 800).

As an example, the axle supports 522-1 and 522-2 may be part of the extension 640 of the support 500, for example, where the extension 640 and the axle supports 522-1 and 522-2 may be die-cast as a unitary component, which may also include the column 620.

FIG. 8 shows various views of the assembly 200 that include at least a portion of the mount 800. In the example of FIG. 8, the arm 700 is shown as including a side wall 732-1 with an opening 734-1 and an opposing side wall 732-2 with an opening 734-2. As shown, the mount 800 includes a main plate 810 and an actuator 820 that may slide to move a spring-biased plate for latching and unlatching the mount 800 from a monitor (e.g., where one or more prongs of the spring-biased plate may engage one or more sockets of the recess 943 of the monitor 300).

In the example of FIG. 8, the mount 800 includes supports 542-1 and 542-2, outer covers 544-1 and 544-2 and inner covers 546-1 and 546-2. As an example, the supports 542-1 and 542-2 may be bolted to the main plate 810 of the mount 800 (e.g., to form, in part, the arm joint 540). As shown, the supports 542-1 and 542-2 may support a cross-member 525 (see dashed lines), which may be an axle with threaded ends that receive nuts to apply a compressive force. Such a compressive force may be applied to the upper portion 730 of the arm 700 to allow for pivoting of the main plate 810 of the mount 800, for example, to pivot a monitor about the arm joint 540, and to hold the mount 800 at a particular pivot angle with the monitor attached thereto.

Figure 9:
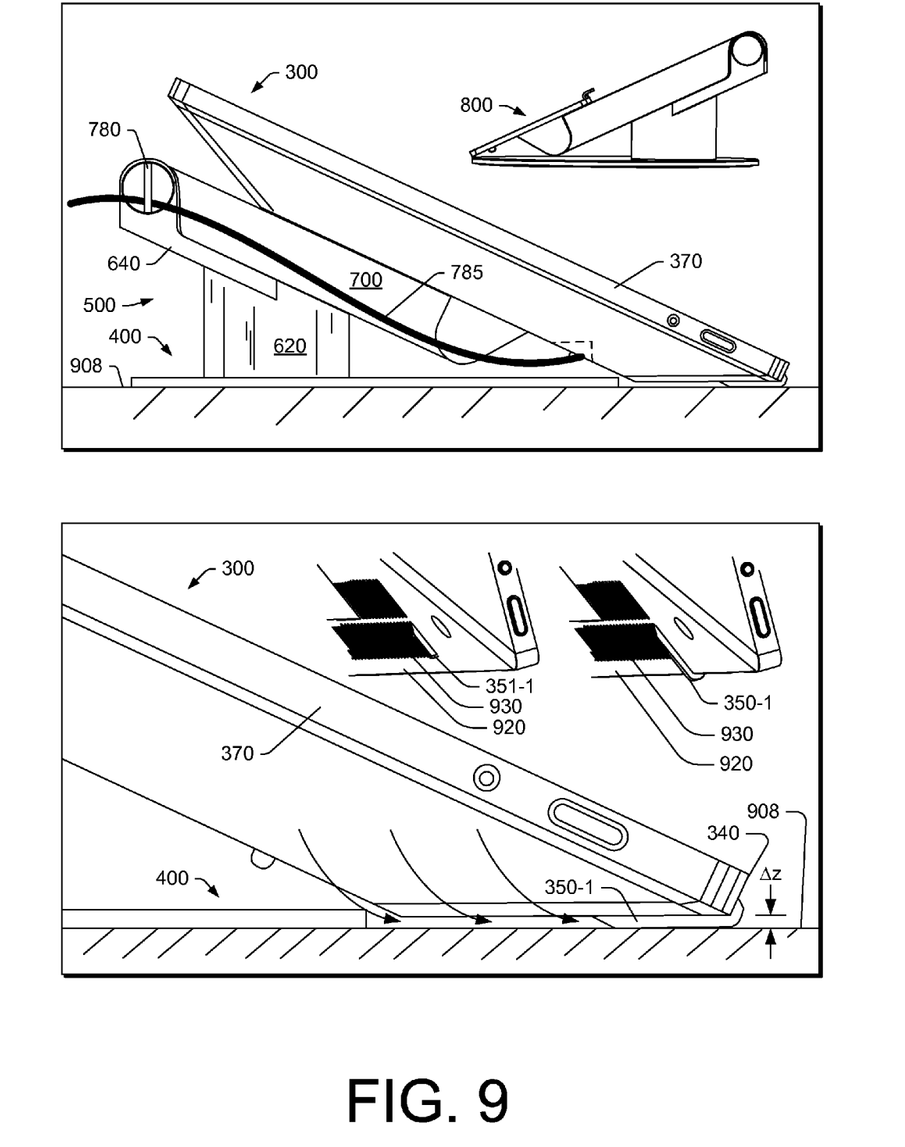
FIG. 9 is a series of views of an example of a monitor mounted to an assembly.

FIG. 9 shows side views of the assembly 200 where an upper view shows the assembly 200 with the monitor 300 along with a cable 785 extending from the monitor 300 and through the cable guide 780 and where a lower view shows the assembly 200 with the monitor 300 in a touch mode orientation as being supported in part by a bumper 350-1 or 351-2 or bumpers that provide a clearance with respect to a surface 908, for example to allow for flow of air to the vents 930.

As shown in FIG. 9, the cable 785 is connected to the monitor 300 via a connector disposed in the connector recess 950 (see, e.g., dashed line) and passes through the cable guide 780. For example, the cable 785 may be a power cable that provides power to the monitor 300. As mentioned, a connector disposed in the connector recess 950 may be disposed at an angle (see, e.g., the angle φ in FIG. 6) to facilitate guidance of a cable or cables by the cable guide 785. The angle may facilitate cable guidance (e.g., sliding, etc.) as the monitor 300 is adjusted from one orientation to another orientation. For example, consider moving from the table orientation to the touch mode orientation where the angle of a connector directs a cable connected thereto toward the cable guide 785.

As shown in FIG. 9, the bumper 350-1 (e.g., or the bumper 351-1) provides a clearance ($\Delta z$) between the surface 920 and the surface 908 sufficient for flow of air to the vents 930 (e.g., vent slots in the surface 920). FIG. 9 also shows a gap between the platform 400 and the monitor 300 (e.g., and the main plate 810 of the mount 800).

As an example, a system can include a horizontal platform that includes a front end, a back end and a midpoint located approximately halfway between the front end and the back end; a support that includes a column, an extension and an arm joint disposed on the extension, where the column extends vertically from the horizontal platform and where the extension extends from the column at an acute angle and positions the arm joint vertically above the horizontal platform and toward the back end of the horizontal platform; a monitor mount that comprises an arm joint; a monitor that comprises a computing device and a touch screen, the monitor being mountable to the monitor mount; and an arm coupled at a pivot end to the arm joint of the support and coupled at a free end to the arm joint of the monitor mount, the monitor mount being pivotable about the free end of the arm.

As an example, a system can include a monitor mounted to a monitor mount where a surface located between a pivot end and a free end of an arm connected to the monitor mount at the free end of the arm and a surface of a support that supports the pivot end of the arm contact to support the monitor in a touch mode orientation. In such an example, the touch mode orientation may orient a touch screen of the monitor at an angle of approximately 25 degrees with respect to a horizontal platform to which the support is connected.

As an example, a system that includes an assembly and a monitor mounted to the assembly can include a surface of the monitor and another surface of the arm that contact each other to support the monitor in the touch mode orientation. As an example, in a touch mode orientation of a monitor mounted to an assembly, a monitor mount of the assembly may be displaced vertically above a horizontal platform of the assembly.

As an example, a system that includes an assembly and a monitor mounted to the assembly can include a bumper attached to the monitor for contacting a surface to support the monitor in a touch mode orientation, for example, where the surface supports a horizontal platform of the assembly. In such an example, the monitor can include airflow vents where, for example, the bumper displaces the airflow vents a distance above the surface.

As an example, a system can include an assembly and a monitor where the monitor is mounted to a monitor mount of the assembly and where an arm of the assembly pivots to a maximum pivot angle to support the monitor in a table orientation that orients a touch screen of the monitor parallel to and facing away from a horizontal platform of the assembly from which a support extends that includes an extension and an arm joint for pivotable attachment of the arm. As an example, a maximum pivot angle may be approximately 55 degrees. As an example, an arm joint of a support can include a stop mechanism that defines a maximum pivot angle of the arm. As an example, an arm joint of a support can include a bar where a pivot end of an arm includes a stop surface that pivots with the arm and where contact between the bar and the stop surface defines a maximum pivot angle.

As an example, a system can include an assembly and a monitor where the monitor is mounted to a monitor mount of the assembly and where for a vertical orientation of a touch screen of the monitor with respect to a horizontal platform of the assembly, the touch screen of the monitor is positionable in orientations only between the mid-point and the front end of the horizontal platform. In such an example, the monitor can include a bumper mounted to a lower edge of the monitor where in a lowermost vertical orientation of the touch screen the bumper contacts the horizontal platform to support the monitor.

As an example, a system can include an assembly and a monitor where a stop mechanism defines a maximum pivot angle of an arm of the assembly that maintains the center of mass of the monitor above a horizontal platform of the assembly for pivotable orientations of the monitor about an arm joint of a monitor mount of the assembly to which the arm is connected at a free end of the arm.

As an example, a system can include an assembly and a monitor where an arm of the assembly has a minimum pivot angle of approximately minus 25 degrees and a maximum pivot angle of approximately 55 degrees with respect to a horizontal plane that passes through a pivot axis of a pivot end of the arm.

As an example, an assembly can include an arm joint that includes a cable guide. For example, a system may include the assembly and a monitor where the monitor includes a lower edge, an upper edge, and a back side that includes cable connectors disposed at an angle to angle a cable or cables connected thereto toward the upper edge of the monitor. In such an example, a cable connected to one of the cable connectors of the monitor may be slidably supported by the cable guide for orientations of the monitor. As an example, a cable connector of a monitor may dispose cable sockets at an angle of about 45 degrees, for example, with respect to a back side surface that is parallel to a screen surface of the monitor. As an example, in combination with a cable guide, as a monitor is oriented, crimping of one or more cables may be avoided (e.g., from being crimped between an arm and a support, an arm and the monitor, etc.).

As an example, a system can include an assembly and a monitor where mass of the monitor exceeds mass of the assembly (e.g., a combined mass of a horizontal platform, a support, a monitor mount and an arm of the assembly).

As an example, a system can include an assembly and a monitor, for example, where the monitor includes a width and a height that determine a monitor area and where the monitor area is approximately at least 25% greater than a horizontal area of a horizontal platform of the assembly.

As an example, a system can include an assembly and a monitor where, for a touch mode orientation, a surface located between a pivot end and a free end of an arm of the assembly and a surface of a support of the assembly contact to support the monitor; where, for a vertical orientation, a lower edge bumper of the monitor contacts a horizontal platform of the assembly to support the monitor; where, for a free orientation, the arm supports the monitor; and where, for a table orientation, the arm supports the monitor parallel to the horizontal platform at a maximum pivot angle of the arm about an arm joint of the support.

As an example, an assembly can include a horizontal platform with a perimeter where the perimeter includes a shape such as, for example, a conic section, a semi-conic section, an oval, a semi-oval, a stadium and a semi-stadium. As an example, a horizontal platform of an assembly may have a circular perimeter.

As an example, a system can include an assembly and a monitor where the monitor includes airflow vents and a bumper where the bumper includes a first surface to support the monitor in a vertical orientation by contact between the first surface and a horizontal platform of the assembly and a second surface to support the monitor in a touch mode orientation by contact between the second surface and a horizontal surface that supports the horizontal platform, for example, to create a clearance between the horizontal surface and the airflow vents.

As an example, a system can include an assembly and a monitor where, for a touch mode orientation, a surface located between a pivot end and a free end of an arm of the assembly and a surface of a support of the assembly contact to support the monitor; where, for a vertical orientation, a lower edge bumper of the monitor contacts a horizontal platform of the assembly to support the monitor; where, for a free orientation, the arm supports the monitor; and where, for a table orientation, the arm supports the monitor parallel to the horizontal platform at a maximum pivot angle of the arm about an arm joint of the support of the assembly.

As an example, a monitor stand assembly can be configured to orient a monitor in a touch mode orientation where a touch screen of the monitor is angled at an ergonomic angle for receiving multi touch input. In such an example, the footprint of the monitor stand assembly (e.g., area) may be smaller than the touch screen area of the monitor and, for example, the mass of the monitor stand assembly may be less than the mass of the monitor. As an example, a touch mode orientation may be a storage orientation for a monitor, for example, as it may be the most stable orientation for the monitor (e.g., consider a monitor supported against an arm which is supported against an angled portion of a support (e.g., an extension, a column, etc.).

As an example, a monitor stand assembly may include a hinge or pivot axis for an arm that is offset from a centroid of a platform of the assembly in a vertical direction and in a lateral direction, for example, via an extension that extends from a column of a support attached to the platform. In such an example, the column may have a height in centimeters while the extension extends at an angle to amplify the height (e.g., a centimeter or more) of the hinge or arm joint. As an example, the angle may be an ergonomic angle that corresponds to a touch mode orientation of a monitor.

As an example, a monitor stand assembly may be configured to achieve various monitor orientations while maintaining the center of mass of a monitor above a platform of the assembly. For example, a platform of an assembly may be made as small as possible (e.g., diameter for a circular platform) while also providing a safety or stability margin (e.g., an annular ring) about which the center of mass of the monitor does not move above.

As an example, a support that includes an extension to locate an arm joint near a back end of a perimeter of a platform to which the support is attached may be more stable when compared to a central vertical support that locates an arm joint vertically over a central region of a platform. For example, in the latter arrangement, as a monitor is moved forward, the center of mass of the monitor will move forward and may move close to or past an edge of the platform. In contrast, in the former arrangement, where an arm joint is displaced toward the back end of a platform, a larger margin exists for forward movement of the center of mass of the monitor (e.g., which may remain over the platform).

As an example, a monitor may be part of a computing device (e.g., a tablet, touch monitor computing device, monitor computing device, etc.) or may be a separate device connected to a computing device via a wired connection, a wireless connection or a combination of wired and wireless connections. As an example, a monitor may be connected to a network for display of information received via the network and optionally as an input device to transmit information via the network.

With respect to mass, a monitor may have a mass on the order of about a kilogram to about 10 kilograms or more (e.g., 1 kg to about 10 kg, or more).

As an example, a monitor can include various circuitry such as one or more processors, memory and one or more interfaces. In general, a machine or monitor may be considered an information handling device (e.g., for at least display of information). Such a device may be configured for one or more purposes selected from a variety of purposes (e.g., media, gaming, drafting, computing, etc.). As an example, an interface may include a power interface, optionally for charging a battery of a machine. As an example, a screen may be considered a visual interface, optionally with touch capabilities to receive input via touch, whether by a user finger or other implement. Further, as an example, touch can include multi-touch and optionally gestures.

The term "circuit" or "circuitry" is used in the summary, description, and/or claims. As is well known in the art, the term "circuitry" includes all levels of available integration, e.g., from discrete logic circuits to the highest level of circuit integration such as VLSI, and includes programmable logic components programmed to perform the functions of an embodiment as well as general-purpose or special-purpose processors programmed with instructions to perform those functions. Such circuitry may optionally rely on one or more computer-readable media that includes computer-executable instructions. As described herein, a computer-readable medium may be a storage device (e.g., a memory card, a storage disk, etc.) and referred to as a computer-readable storage medium.

Figure 10:
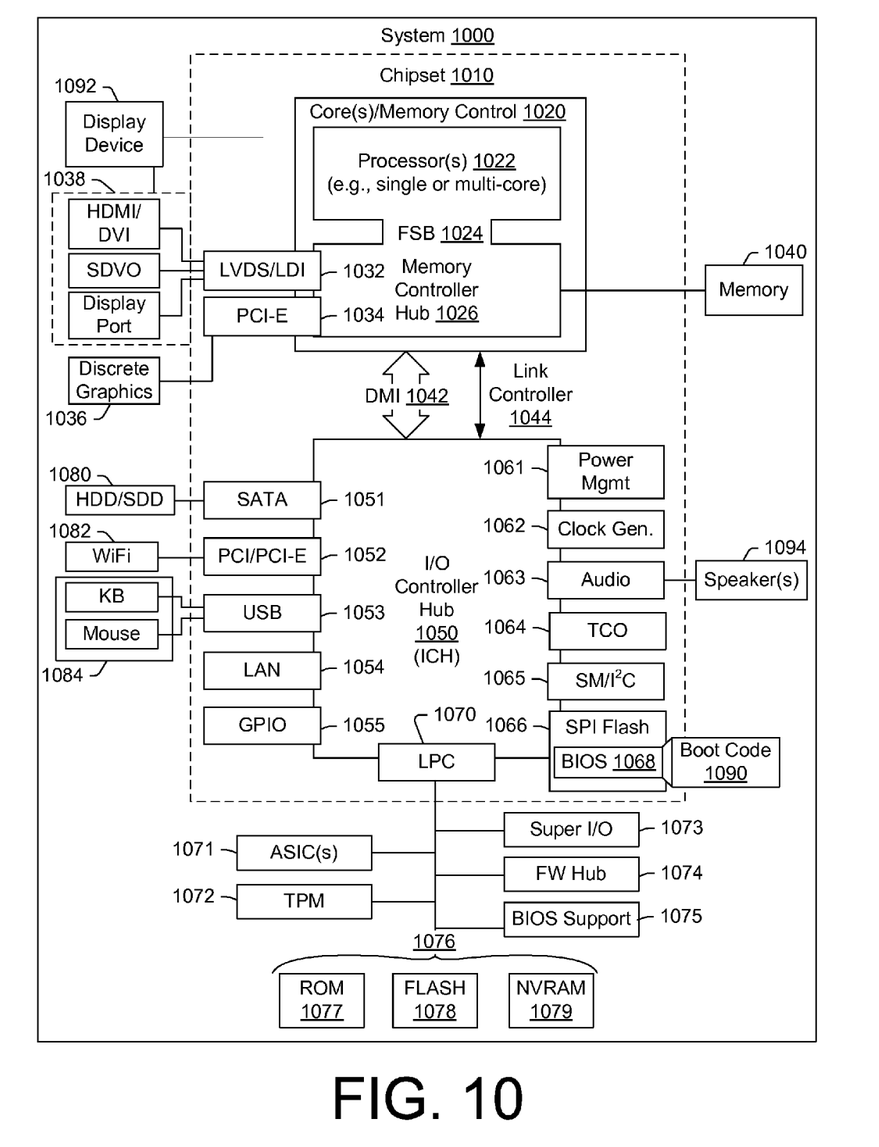
FIG. 10 is a diagram of an example of a machine.

While various examples of circuits or circuitry have been discussed, FIG. 10 depicts a block diagram of an illustrative computer system 1000. The system 1000 may be a computer system sold by Lenovo (US) Inc. of Morrisville, N.C. (e.g., a ThinkStation® system); however, as apparent from the description herein, a satellite, a base, a server or other machine may include other features or only some of the features of the system 1000. As described herein, a monitor or machine such as the monitor 300 may include at least some of the features of the system 1000.

As an example, a monitor may include features such as one or more of the features included in one of the LENOVO® IDEADCENTRE® or THINKCENTRE® "all-in-one" computing devices (e.g., sold by Lenovo (US) Inc. of Morrisville, N.C.). For example, the LENOVO® IDEADCENTRE® A720 computing device includes an Intel® Core i7 processor, a 27 inch frameless multi-touch display (e.g., for HD resolution of 1920×1080), a NVIDIA® GeForce® GT 630M 2 GB graphics card, 8 GB DDR3 memory, a hard drive, a DVD reader/writer, integrated Bluetooth® and 802.11b/g/n Wi-Fi®, USB connectors, a 6-in-1 card reader, a webcam, HDMI in/out, speakers, and a TV tuner.

As shown in FIG. 10, the system 1000 includes a so-called chipset 1010. A chipset refers to a group of integrated circuits, or chips, that are designed to work together. Chipsets are usually marketed as a single product (e.g., consider chipsets marketed under the brands INTEL®, AMD®, etc.).

In the example of FIG. 10, the chipset 1010 has a particular architecture, which may vary to some extent depending on brand or manufacturer. The architecture of the chipset 1010 includes a core and memory control group 1020 and an I/O controller hub 1050 that exchange information (e.g., data, signals, commands, etc.) via, for example, a direct management interface or direct media interface (DMI) 1042 or a link controller 1044. In the example of FIG. 10, the DMI 1042 is a chip-to-chip interface (sometimes referred to as being a link between a "northbridge" and a "southbridge").

The core and memory control group 1020 include one or more processors 1022 (e.g., single core or multi-core) and a memory controller hub 1026 that exchange information via a front side bus (FSB) 1024. As described herein, various components of the core and memory control group 1020 may be integrated onto a single processor die, for example, to make a chip that supplants the conventional "northbridge" style architecture.

The memory controller hub 1026 interfaces with memory 1040. For example, the memory controller hub 1026 may provide support for DDR SDRAM memory (e.g., DDR, DDR2, DDR3, etc.). In general, the memory 1040 is a type of random-access memory (RAM). It is often referred to as "system memory".

The memory controller hub 1026 further includes a low-voltage differential signaling interface (LVDS) 1032. The LVDS 1032 may be a so-called LVDS Display Interface (LDI) for support of a display device 1092 (e.g., a CRT, a flat panel, a projector, etc.). A block 1038 includes some examples of technologies that may be supported via the LVDS interface 1032 (e.g., serial digital video, HDMI/DVI, display port). The memory controller hub 1026 also includes one or more PCI-express interfaces (PCI-E) 1034, for example, for support of discrete graphics 1036. Discrete graphics using a PCI-E interface has become an alternative approach to an accelerated graphics port (AGP). For example, the memory controller hub 1026 may include a 16-lane (x16) PCI-E port for an external PCI-E-based graphics card. A system may include AGP or PCI-E for support of graphics. As described herein, a display may be a sensor display (e.g., configured for receipt of input using a stylus, a finger, etc.). As described herein, a sensor display may rely on resistive sensing, optical sensing, or other type of sensing.

The I/O hub controller 1050 includes a variety of interfaces. The example of FIG. 10 includes a SATA interface 1051, one or more PCI-E interfaces 1052 (optionally one or more legacy PCI interfaces), one or more USB interfaces 1053, a LAN interface 1054 (more generally a network interface), a general purpose I/O interface (GPIO) 1055, a low-pin count (LPC) interface 1070, a power management interface 1061, a clock generator interface 1062, an audio interface 1063 (e.g., for speakers 1094), a total cost of operation (TCO) interface 1064, a system management bus interface (e.g., a multi-master serial computer bus interface) 1065, and a serial peripheral flash memory/controller interface (SPI Flash) 1066, which, in the example of FIG. 10, includes BIOS 1068 and boot code 1090. With respect to network connections, the I/O hub controller 1050 may include integrated gigabit Ethernet controller lines multiplexed with a PCI-E interface port. Other network features may operate independent of a PCI-E interface.

The interfaces of the I/O hub controller 1050 provide for communication with various devices, networks, etc. For example, the SATA interface 1051 provides for reading, writing or reading and writing information on one or more drives 1080 such as HDDs, SDDs or a combination thereof. The I/O hub controller 1050 may also include an advanced host controller interface (AHCI) to support one or more drives 1080. The PCI-E interface 1052 allows for wireless connections 1082 to devices, networks, etc. The USB interface 1053 provides for input devices 1084 such as keyboards (KB), one or more optical sensors, mice and various other devices (e.g., microphones, cameras, phones, storage, media players, etc.). On or more other types of sensors may optionally rely on the USB interface 1053 or another interface (e.g., I²C, etc.). As to microphones, the system 1000 of FIG. 10 may include hardware (e.g., audio card) appropriately configured for receipt of sound (e.g., user voice, ambient sound, etc.).

In the example of FIG. 10, the LPC interface 1070 provides for use of one or more ASICs 1071, a trusted platform module (TPM) 1072, a super I/O 1073, a firmware hub 1074, BIOS support 1075 as well as various types of memory 1076 such as ROM 1077, Flash 1078, and non-volatile RAM (NVRAM) 1079. With respect to the TPM 1072, this module may be in the form of a chip that can be used to authenticate software and hardware devices. For example, a TPM may be capable of performing platform authentication and may be used to verify that a system seeking access is the expected system.

The system 1000, upon power on, may be configured to execute boot code 1090 for the BIOS 1068, as stored within the SPI Flash 1066, and thereafter processes data under the control of one or more operating systems and application software (e.g., stored in system memory 1040). An operating system may be stored in any of a variety of locations and accessed, for example, according to instructions of the BIOS 1068. Again, as described herein, a satellite, a base, a server or other machine may include fewer or more features than shown in the system 1000 of FIG. 10. Further, the system 1000 of FIG. 10 is shown as optionally include cell phone circuitry 1095, which may include GSM, CDMA, etc., types of circuitry configured for coordinated operation with one or more of the other features of the system 1000.

CONCLUSION

Although examples of methods, devices, systems, etc., have been described in language specific to structural features and/or methodological acts, it is to be understood that the subject matter defined in the appended claims is not necessarily limited to the specific features or acts described. Rather, the specific features and acts are disclosed as examples of forms of implementing the claimed methods, devices, systems, etc.

What is claimed is:

1. A system comprising:
   a horizontal platform that comprises a front end, a back end and a midpoint located approximately halfway between the front end and the back end;
   a support that comprises
     a column,
     an extension and
     a support arm joint disposed on the extension,
       wherein the column extends vertically from the horizontal platform and
       wherein the extension extends from the column at an acute angle and positions the support arm joint vertically above the horizontal platform and toward the back end of the horizontal platform;
   a monitor mount that comprises a monitor mount arm joint;
   a monitor that comprises a computing device and a touch screen, the monitor being mountable to the monitor mount; and
   an arm coupled at a pivot end to the support arm joint and coupled at a free end to the monitor mount arm joint, the monitor mount being pivotable about the free end of the arm,
   wherein the support arm joint comprises an axle supported by axle supports and a fixed bar and wherein the arm comprises an aperture for passage of the axle and a stop surface that pivots with the arm and that contacts the fixed bar to define a maximum pivot angle for the arm with respect to the support arm joint.

2. The system of claim 1 wherein the monitor is mounted to the monitor mount and wherein a surface located between the pivot end and the free end of the arm and a surface of the support contact each other to support the monitor in a touch mode orientation.

3. The system of claim 2 wherein the touch mode orientation orients the touch screen of the monitor at an angle of approximately 25 degrees with respect to the horizontal platform.

4. The system of claim 2 wherein a surface of the monitor and another surface of the arm contact to support the monitor in the touch mode orientation.

5. The system of claim 2 wherein the monitor comprises a bumper for contacting a surface to support the monitor in the touch mode orientation wherein the surface supports the horizontal platform.

6. The system of claim 5 wherein the monitor comprises airflow vents and wherein the bumper displaces the airflow vents a distance above the surface.

7. The system of claim 1 wherein the monitor is mounted to the monitor mount and wherein the arm pivots to the maximum pivot angle to support the monitor in a table orientation that orients the touch screen parallel to and facing away from the horizontal platform.

8. The system of claim 1 wherein the monitor is mounted to the monitor mount and wherein for a vertical orientation of the touch screen of the monitor with respect to the horizontal platform, the touch screen of the monitor is positionable in orientations only between the mid-point and the front end of the horizontal platform.

9. The system of claim 8 wherein the monitor comprises a bumper mounted to a lower edge of the monitor and wherein in a lowermost vertical orientation of the touch screen the bumper contacts the horizontal platform to support the monitor.

10. The system of claim 1 wherein the maximum pivot angle of the arm maintains the center of mass of the monitor above the horizontal platform for pivotable orientations of the monitor about the monitor mount arm joint.

11. The system of claim 1 wherein the arm comprises a minimum pivot angle of approximately minus 25 degrees and a maximum pivot angle of approximately 55 degrees with respect to a horizontal plane that passes through a pivot axis of the pivot end of the arm.

12. The system of claim 1 wherein the support arm joint comprises a cable guide.

13. The system of claim 12 wherein the monitor comprises a lower edge, an upper edge, and a back side that comprises cable connectors disposed at an angle to angle cables connected thereto toward the upper edge.

14. The system of claim 1 wherein the monitor comprises a width and a height that determine a monitor area and wherein the monitor area is approximately at least 25% greater than a horizontal area of the horizontal platform and wherein mass of the monitor exceeds a combined mass of the horizontal platform, the support, the monitor mount and the arm.

15. The system of claim 1 comprising
a touch mode orientation wherein a surface located between the pivot end and the free end of the arm and a surface of the support contact to support the monitor,
a vertical orientation wherein a lower edge bumper of the monitor contacts the horizontal platform to support the monitor,
a free orientation wherein the arm supports the monitor, and
a table orientation wherein the arm supports the monitor parallel to the horizontal platform at a maximum pivot angle of the arm about the support arm joint.

16. The system of claim 1 wherein the horizontal platform comprises a perimeter wherein the perimeter comprises a shape selected from a group consisting of a conic section, a semi-conic section, an oval, a semi-oval, a stadium and a semi-stadium.

17. The system of claim 1 wherein the horizontal platform comprises a circular perimeter.

18. The system of claim 1 wherein the monitor comprises airflow vents and a bumper wherein the bumper comprises a first surface to support the monitor in a vertical orientation by contact between the first surface and the horizontal platform and a second surface to support the monitor in a touch mode orientation by contact between the second surface and a horizontal surface that supports the horizontal platform and to create a clearance between the horizontal surface and the airflow vents.

19. An apparatus comprising:
a horizontal platform that comprises a front end, a back end and a midpoint located approximately halfway between the front end and the back end;
a support that comprises
a column,
an extension and
a support arm joint disposed on the extension,
wherein the column extends vertically from the horizontal platform and
wherein the extension extends from the column at an acute angle and positions the support arm joint vertically above the horizontal platform and toward the back end of the horizontal platform;
a monitor mount that comprises a monitor mount arm joint; and
an arm coupled at a pivot end to the support arm joint and coupled at a free end to the monitor mount arm joint, the monitor mount being pivotable about the free end of the arm
wherein the support arm joint comprises an axle supported by axle supports and a fixed bar and wherein the arm comprises an aperture for passage of the axle and a stop surface that pivots with the arm and that contacts the fixed bar to define a maximum pivot angle for the arm with respect to the support arm joint.

20. A system comprising:
a horizontal platform that comprises a front end, a back end and a midpoint located approximately halfway between the front end and the back end;
a support that comprises
a column,
an extension and
a support arm joint disposed on the extension,
wherein the column extends vertically from the horizontal platform and
wherein the extension extends from the column at an acute angle and positions the support arm joint vertically above the horizontal platform and toward the back end of the horizontal platform;
a monitor mount that comprises a monitor mount arm joint;
a monitor that comprises a computing device and a touch screen, the monitor being mountable to the monitor mount; and
an arm coupled at a pivot end to the support arm joint and coupled at a free end to the monitor mount arm joint, the monitor mount being pivotable about the free end of the arm,
wherein the monitor is mounted to the monitor mount, wherein the arm pivots to a maximum pivot angle to support the monitor in a table orientation that orients the touch screen parallel to and facing away from the horizontal platform, wherein the support arm joint comprises a bar, wherein the pivot end of the arm comprises a stop surface that pivots with the arm and wherein contact between the bar and the stop surface defines the maximum pivot angle.

* * * * *